INVENTOR.
George R. Perez
BY [signature]
AGENT

WAFER STACKING AND LOADING DEVICE

Filed June 25, 1958 3 Sheets-Sheet 2

INVENTOR.
George R. Perez
BY Joel B. Johnson
AGENT

Dec. 19, 1961 G. R. PEREZ 3,013,672

WAFER STACKING AND LOADING DEVICE

Filed June 25, 1958 3 Sheets-Sheet 3

INVENTOR.
George R. Perez
BY
Joel B. Johnson
AGENT

United States Patent Office
3,013,672
Patented Dec. 19, 1961

3,013,672

WAFER STACKING AND LOADING DEVICE

George R. Perez, Alexandria, Va., assignor, by mesne assignments, to Illinois Tool Works, Chicago, Ill., a corporation of Illinois Filed June 25, 1958, Ser. No. 744,371
8 Claims. (Cl. 214—7)

This invention is directed to apparatus for aligning a plurality of ceramic wafers in a spaced parallel relationship. The invention is particularly incorporated in an apparatus for aligning ceramic wafers, arranged in one alignment pattern, into a different alignment pattern in which the wafers are positioned parallel to each other and spaced from each other so that they may be handled for further processing.

One type of modular circuit element consists of a plurality of square ceramic wafers spaced from each other in parallel planes and joined together by metallic riser wires or leads. Each ceramic wafer may consist of a flat plate of ceramic material, such as steatite, having either a square or rectangular configuration. Normally, on the surfaces of the ceramic wafers there are metalized areas to which circuit components such as resistors or capacitors may be conductively fixed. The several wafers making up the circuit module are conductively connected together between riser wires, which form conductive leads between the circuit elements mounted on these several wafers. In this manner, the module assembly can be fabricated to form a circuit component, which can easily be fixed into or removed from an electronic circuit. Furthermore, the module may be designed to have attached thereto a tube socket, which in turn is connected into the circuit portion of the module and whereby the module may comprise the circuit for a tube mounted in the socket.

In the fabrication of module assemblies of the type described above, it is necessary to handle a large number of ceramic wafers many times. Fabrication of modules by hand is inefficient and relatively slow. It is, therefore, desirable that processing of the individual wafers be done rapidly and with precision by mechanical means, whereby the fabrication of a large number of modules can be undertaken efficiently and with a minimum of manual effort. Machines have been designed and operated by which a large number of wafers are fed into a track or feed guide such that the wafers will fall by gravity down the track into alignment in a common plane. It is also desirable, however, that the wafers at different stages of processing be arranged in alignment in parallel planes and spaced from each other whereby further processing is expedited. Also this is the arrangement in which the wafers are joined together by the riser wires to form the modules. It has, therefore, been found necessary to be able to rapidly change the alignment of the wafers from one in which they are positioned in a common plane and in abutment with each other to an arrangement in which the wafers are aligned in parallel planes and spaced from each other.

It is, therefore, an object of this invention to provide a novel apparatus for changing the alignment of a plurality of wafers from that in a common plane to one in parallel planes.

It is also an object of this invention to provide a novel apparatus for arranging a plurality of ceramic wafers in alignment in parallel planes.

It is another object of this invention to provide a novel apparatus for changing the alignment of a plurality of flat ceramic wafers from that in a common plane to one in which the wafers are aligned in parallel spaced planes, to enable further processing of the wafers.

A specific embodiment of the invention utilizes a track support device for feeding a row of ceramic wafers onto a horizontal guide support and to a position above a plurality of collector chutes. Each collector chute includes spaced, parallel and vertically disposed walls to receive one of the wafers and to maintain the wafer in a substantially vertical position. All of the collector chutes are aligned in parallel planes such that when each chute holds a single wafer, all the wafers will be in substantially horizontal arrangement and in parallel planes. Between the horizontal guide support and the collector chutes, there are mounted plurality of guide surfaces with a different one of the surfaces aligned with each of the collector chutes. Each guide surface has a curvature such that it extends from a position substantially tangent to the horizontal guide support to a position aligned with one of the vertical walls of a respective collector chute. In operation, the wafers in the horizontal guide support are released and permitted to drop onto the guide surfaces, which properly rotate each wafer through a 90° angle so that it will fall into one of the collector chutes.

Figures 2, 2A, 2B:
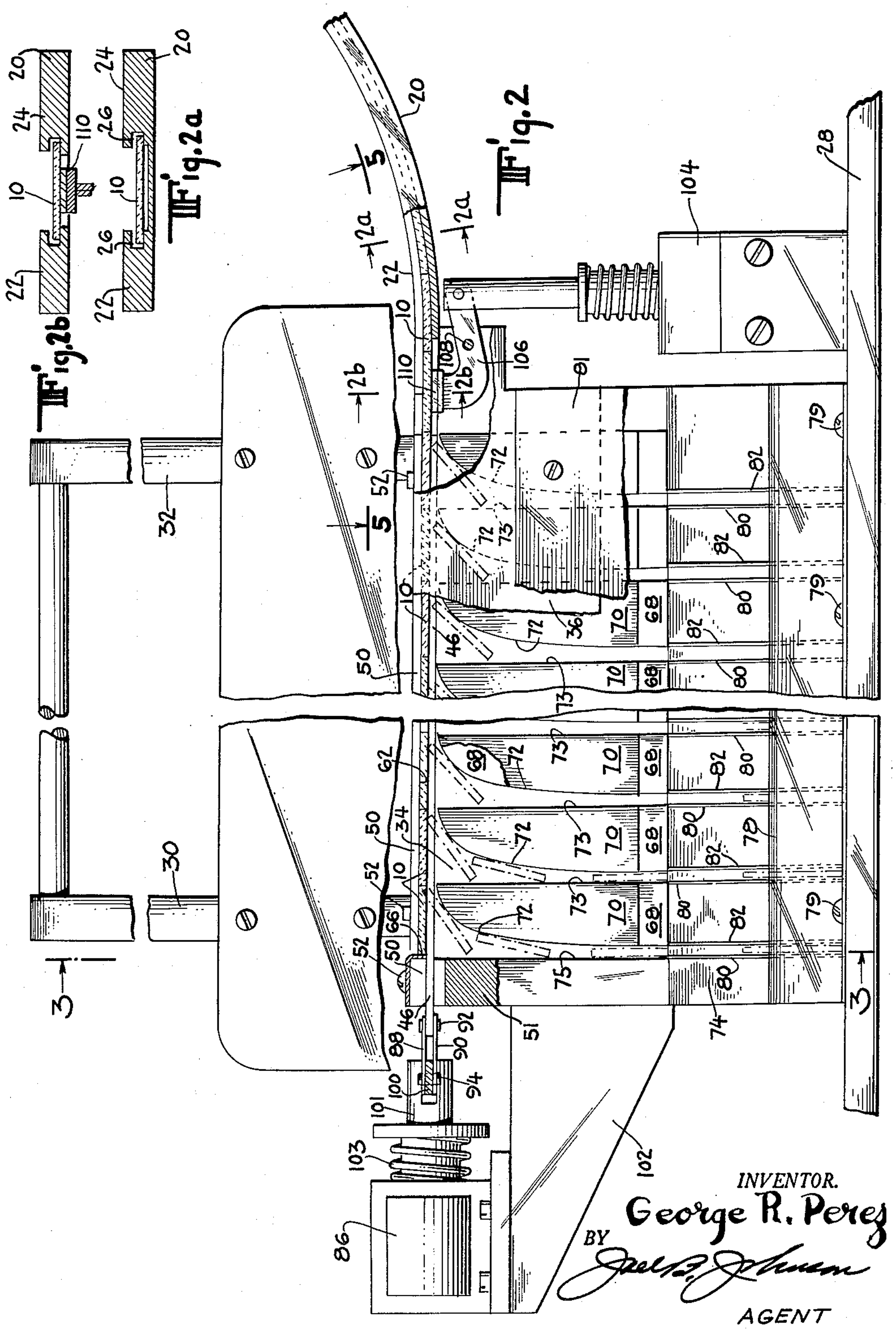
FIG. 2 is a view in elevation with parts in section of the wafer stacking device, in accordance with the invention.

FIGS. 2*a* and 2*b* are sectional views of the track guide taken along section line **2*a*—2*a* and 2*b*—2*b*** of FIG. 2.

Figures 1, 3:
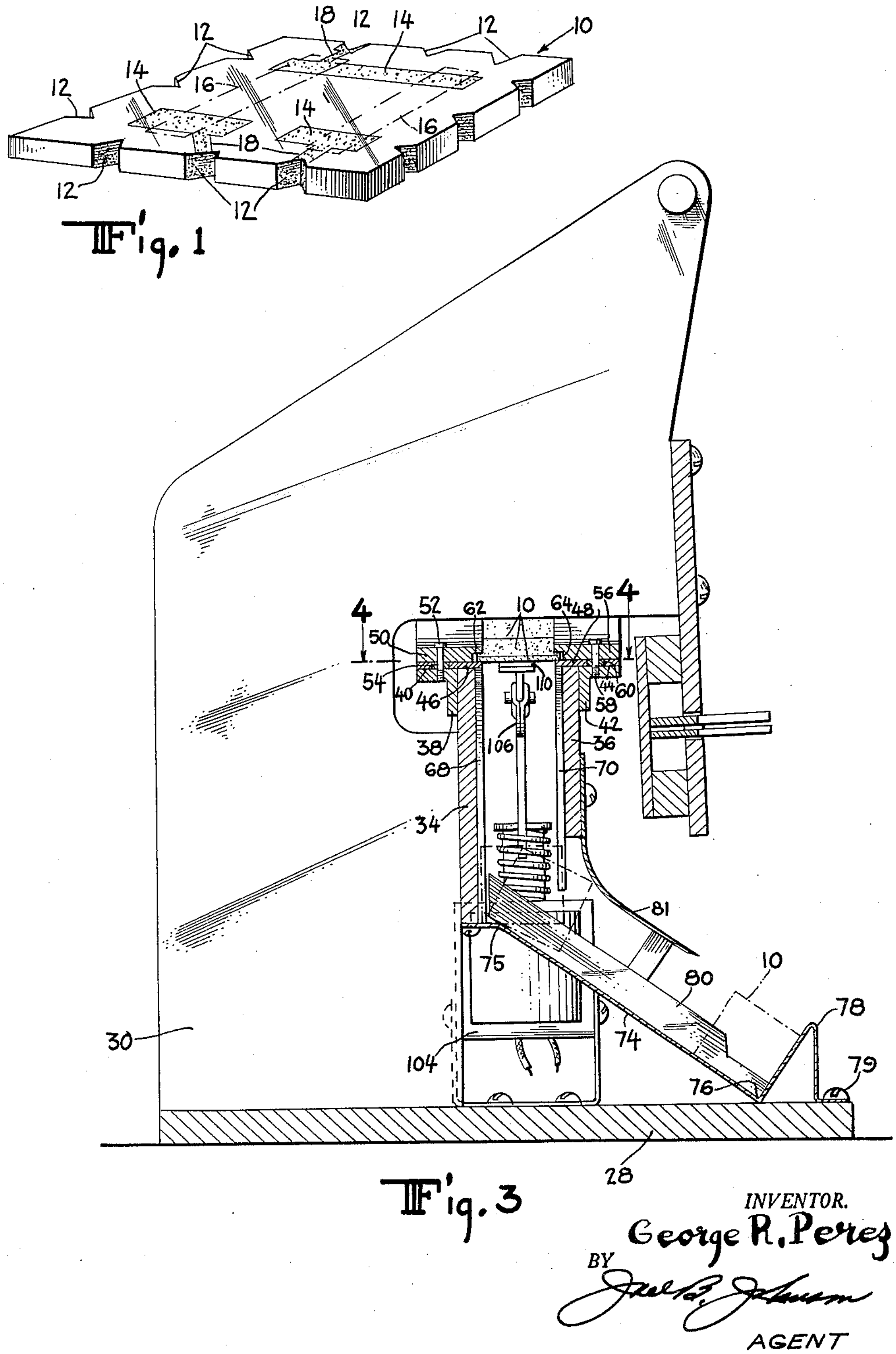
FIG. 1 is a dimetric view of a wafer, which may be used in the disclosed specific embodiment of applicant's invention as designed.

FIG. 3 is a sectional view taken along section lines 3—3 of FIG. 2.

Figure 4:
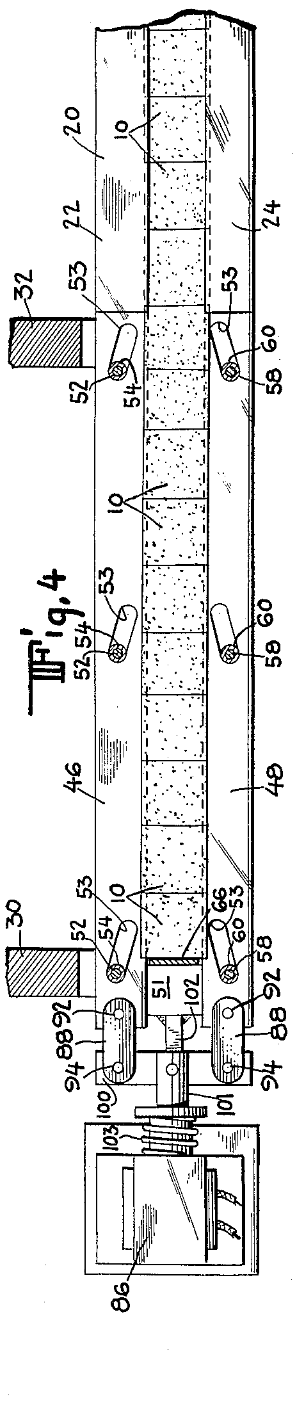

FIG. 4 is a sectional view taken along lines 4—4 of FIG. 3.

Figure 5:
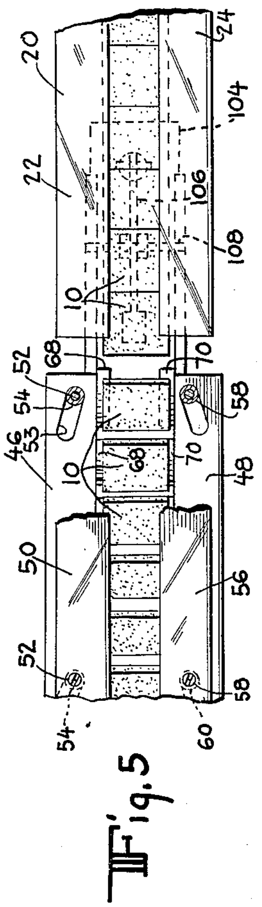

FIG. 5 is a partial sectional view taken along lines 5—5 of FIG. 2.

Figure 6:
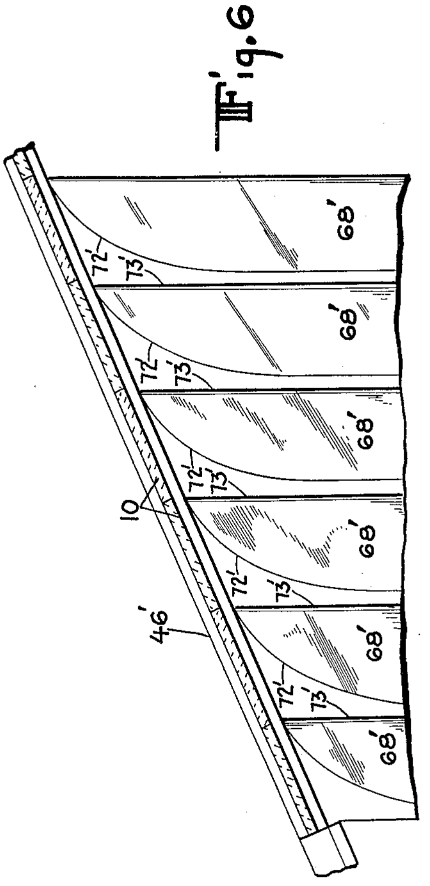

FIGURE 6 is a partial elevational view, portions being in section, similar to FIGURE 2, showing an alternate form of the invention.

FIG. 1 shows a ceramic wafer 10. Several wafers, of the type shown in FIG. 1, are connected together to form a wafer assembly or module. Each wafer 10 consists of a square piece or plate of ceramic material such as steatite. The particular shape is not significant, nor is it critical, as such wafers may be rectangular or even round or oval-shaped. However, the particular wafer shown in FIG. 1 has a small height dimension between its parallel surfaces relative to the length and width dimensions of the surfaces. For example, the dimensions of wafers, which have been successfully used in forming module structures, are a length and width of approximately ⅞ of an inch and a thickness or height of substantially $\frac{1}{16}$ of an inch.

The wafer of FIG. 1 is formed with three notches 12 in the peripheral edge of each side of the wafer. The top surface of wafer 10, as shown in FIG. 1, has formed thereon metalized areas 14, which constitute conductive terminals for small resistors or capacitors which may be subsequently fixed between the terminals. FIG. 1 shows in phantom the position of a pair of resistors 16 which may be mounted between two of the metalized terminals areas 14. Metalized paths 18 extend from each one of the terminal areas 14 to a different one of the notches 12. Each of the notches 12 are also metalized to provide a conductive area within the notches. The metalized areas 14 and 18 as well as the areas of the wafer within the notches 12, which are metalized, may be formed by painting or spraying any appropriate metal suspension such as a mixture of silver metal and glass. If the metalizing material is sprayed, the areas of wafer 10, which are not to be coated may be masked during the spraying operation.

After the wafer 10 has been metalized, it is desirable to tin the metal areas by dipping the metalized wafer into a pool of molten solder. The dipping procedure retains sufficient solder on the metalized portions of the ceramic wafers 10 to facilitate the soldering of the additional components to the wafer. For example, the small resistors 16, as previously indicated, may be fixed between the now tinned terminal areas 14. Other circuit components such as capacitors may also be soldered between appropriate metalized terminal areas. Furthermore, in assembling a plurality of wafers 10 into a module structure, riser wires are used to join the wafers together. This procedure involves the alignment of several wafers in parallel planes so that corresponding notches of the wafers are aligned. A riser or lead wire may then be soldered to each wafer and within the aligned notches. Normally, a plurality of riser wires are used in this manner to assemble a module.

During the fabrication of each wafer, however, it has been found that in processing the wafers, it is necessary at times to align them in a common plane, in a single file arrangement, while at other times it is necessary to align a plurality of wafers in parallel planes. It is, therefore, desirable to be able to quickly change the wafers from one type of alignment to another type with a minimum of handling and delay.

FIG. 2 discloses a wafer stacking or alignment apparatus, in which a plurality of wafers are changed from one type of alignment to another. Wafers 10 are fed into the apparatus by a track 20. FIG. 2*a* indicates the cross-sectional configuration of the track 20, which may consist of a pair of spaced rail portions 22 and 24 which are fixed parallel to each other with each having a groove 26 on an inner surface. The grooves 26 are positioned opposite each other to provide a guide slot for the wafers 10. The track 20 extends from a point above the apparatus of FIG. 2 to provide a gravity feed of the wafers. The wafers are fed into the upper end of track 20 by any appropriate means and will slide by gravity down track 20.

The apparatus of FIGS. 2 and 3 consists of a base support member 28, to which is securely fixed a pair of end plates or brackets 30 and 32. Extending between end plates 30 and 32 and securely fixed thereto are a pair of side plates 34 and 36. As indicated in FIG. 3, an angle iron 38 is fixed, such as by welding, to plate 34 with one face 40 of angle iron 38 positioned flush with the top edge of side plate 34. In a similar manner, an angle iron 42 is fixed to side plate 36 with a surface 44 flush with the top edge of plate 36. A track support is formed by a pair of movable rail plates 46 and 48 mounted for sliding movement on the surfaces 40 and 48, respectively, of angle irons 38 and 42. A fixed rail plate 50 is mounted by threaded bolts 52 to angle iron 38. Spacer bushings 54 support the fixed rail plate 50 above the movable rail plate 46 with sufficient clearance to permit the rail plate 46 to be moved without binding by the fixed plate 50. In a similar manner, a second fixed rail plate 56 is mounted by threaded bolts 58 to the angle iron 42 and with bushings 60 providing clearance between the fixed rail plate 56 and the movable rail plate 48. Fixed rail plate 50 has an open groove 62 formed along the inner lower edge as viewed in FIGS. 2 and 3. In a similar manner, the fixed rail plate 56 has an open groove 64 also formed in its lower inner surface. The movable rail plate 46 is positioned to extend beneath the groove 62 and form a guide slot therewith having a spacing greater than the width of the wafers 10. In a similar manner, the movable guide plate 48 is positioned to extend below groove 64 to form a guide track.

Movable guide plates 46 and 48 include cam slots 53 (FIG. 4) inclined at an angle to their longitudinal axes, respectively. Each bolt 52 passes through a different cam slot 53 in guide plate 46 and similarly each bolt 58 passes through a different cam slot 53 in guide plate 48. Longitudinal movement of plates 46 and 48 will cause a camming action between bushings 54 and 60 and cam slots 53, respectively to force guide plates 46 and 48 to move laterally. The movable rail plates 46 and 48 and the fixed rail plates 50 and 56 form a guide support structure, for supporting a plurality of wafers 10 in a substantially horizontal position. The lower end of feed track 20 is fixed to and aligned with the guide support structure constituting the movable and fixed plates 46, 48, 50, and 56. Thus, wafers fed by gravity down the feed track 20 will be forced by the weight of wafers above them in the feed track 20 to move along the horizontal guide support structure until the lead wafer strikes a stop plate 66.

FIGS. 2 and 4 disclose a plurality of wafers 10 supported on the top surface of movable rail plates 46 and 48. The wafers are in tight abutting contact with each other due to the weight of additional wafers in the feed track 20. This accurately positions each wafer above a pair of guide plates 68 and 70. As shown in FIG. 3, each guide plate 68 is fixed to the side plate 34 and each guide plate 70 is fixed to side plate 36. The guide plates 68 and 70 have their upper ends positioned directly under the inner edges of the two movable rail plates 46 and 48, respectively. Also, each guide plate 68 and 70 is thus positioned under opposite edges of one of the wafers 10 supported by the movable rail plates 46 and 48. Each guide plate 68 and 70 has a curved guide surface 72 formed in a curve on one side of each plate and extending from a point immediately below one of the movable guide rails 46 or 48 and extending toward the lower end of the respective guide plate. The curved surfaces of the guide plates 68 and 70 are at their upper ends substantially tangential to the respective movable rail plate 46 or 48, to which they are adjacent. Each guide plate 68 and 70 also has a flat guide surface 73 on the opposite side from the curved surface 72.

Stop plate 66 extends downwardly to present a flat guide surface 75 toward the curved surfaces 72 of the first plates 68 and 70.

Fixed to the bottom edge of side plate 34 is a chute guide support plate 74. As shown more clearly in FIG. 3, plate 74 is bent at an angle to the horizontal at 75 adjacent to the plate 34 so that plate 74 extends at an angle downwardly and contacts the top surface of the base support member 28. At this point plate 74 is bent at 90° to form a trough portion 76. The lower edge of plate 74 is continued upwardly and then bent over sharply at 78 and continues downwardly in a vertical plane until it meets the top surface of the base support member 28 to which it is fastened at 79.

Fixed to the inclined upper surface of the chute guide support plate 74 are pairs of guide plates 80 and 82. As shown more clearly in FIG. 2, each pair of guide plates 80 and 82 is positioned beneath the channel space formed between the flat surface 73 of one guide plate 68 and the curved surface 72 of the adjacent guide plate 68. The arrangement is such that each of the chute guide plates 80 is mounted in a vertical plane which is substantially the extension of one surface 73, while the other chute guide plate 82 is closely spaced from the other chute guide plate 80 of the pair and in a vertical plane tangent to one curved surface 72 at its lower point.

The pairs of chute guide plates 80 and 82 are spaced an amount from each other which is slightly greater than the width of a wafer 10.

FIG. 4 discloses a plane view of the movable rail plates 46 and 48. Means are provided for moving the rail plates simultaneously away from each other so as to drop the wafers 10 onto the guide surfaces 72 and 73. To one end of each of the movable rail plates 46 and 48 are fixed a pair of links 88 and 90, which are loosely pinned at one end to a respective one of the rail plates by a flat headed pin 92. The two pairs of links 88 and 90 are loosely fastened at their other ends by pins 94 to a yoke member 100, which in turn is pinned to the movable armature 101 of a solenoid 86.

Actuation of solenoid 86 moves rail plates 46 and 48 to the left as viewed in FIGS. 2 and 4. Bushings 54 and 60 cam the rail plates outwardly from under wafers 10 to allow the wafers to fall against the surfaces of guide plates 68 and 70. The rail plates 46 and 48 may be returned to their wafer supporting position upon the deactivation of solenoid 86 by any appropriate manner such as a return spring 103.

The movement of rail plates 46 and 48 away from each other to release the wafers may also be provided by a manually operable means such as a lever pivotally mounted on a support bracket and having one arm loosely connected to yoke 100.

In operation, the feed track 20 is completely filled with wafers which slide onto the upper surfaces of the movable rail plates 46 and 48 until a plurality of wafers 10 are positioned in abutting relationship on the horizontal supporting track structure, with one wafer positioned over each pair of guide plates 68 and 70. Operation of a solenoid 104 by the operator rocks a stop pad 110 against the lower surface of a wafer 10 to force the wafer against the track 20 to prevent the wafer and all wafers in track 20 above it from sliding onto the horizontal guide support during operation of the device. The energization of solenoid 86 causes bolts 52 and 58 to cam outwardly the respective movable rail plates 46 and 48. This action removes all support from the wafers 10, which immediately fall by gravity onto the guide surfaces 72 of plates 68 and 70 as described above. As schematically indicated in FIG. 2, one end (the front) of each wafer falls freely while the opposite end (the rear) strikes a pair of cam surfaces 72 respectively of a set of plates 68 and 70. This causes the wafer to rotate about a horizontal axis and fall into the groove formed between surfaces 73 and 72 of the adjacent guide plates 68 and 70. Because the chute guide plates 80 and 82 are aligned, as described above, with the chute channel between surfaces 72 and 73, each wafer 10 will drop into the chute formed between a pair of plates 80 and 82. Side plates 34 and 36 are spaced only slightly more than the width of a wafer 10, so that as the wafers drop onto the chute guide support plate 74, they are prevented from turning about an axis normal to their surface. Each wafer will strike the horizontal portion 75 of plate 74, at one corner only which will cause the wafer to rotate clockwise as viewed in FIG. 3 and to slide down the inclined surface of plate 74. The chute guide plates 80 and 82 retain the wafers in vertical planes as they move to a final position in the trough 76 of plate 74. The position that each wafer assumes at various stages of its travel is indicated in dotted lines in FIGS. 2 and 3.

To prevent the wafer from tumbling down the chute formed by the parallel plates 80 and 82, a partial cover plate 81 is fastened to side plate 36 and is bent so that its lower portion will be inclined in a plane parallel to that of chute guide support plate 74. The spacing between the parallel portions of plates 74 and 81 is slightly more than the length of a wafer 10. Plate 81 thus permits the wafers to slide on one edge down the guide support plate 74 instead of tumbling.

The movable rail plates have been disclosed as being positioned in a substantially horizontal plane. However, practice of the invention is not limited to this arrangement since the apparatus may be designed with the movable rail plates inclined to the horizontal end, as schematically shown in FIG. 6. The operation of the device in FIG. 6 is similar to that disclosed and described above relating to FIGS. 2, 3, and 4. Furthermore, it is obvious that the wafers 10 need not be of a square configuration but may be of other shapes which lend themselves to being processed by the apparatus disclosed. In FIG. 6 structures corresponding to similar structures in FIGS. 1 to 4 are indicated as prime numbers.

I claim:

1. Apparatus for aligning a plurality of flat ceramic wafers in a spaced parallel array, said wafers having a pair of parallel surfaces spaced from each other by a thickness dimension which is small relative to the dimensions of said parallel surfaces, said apparatus comprising a track having a surface for supporting said wafers aligned in abutting relationship, a plurality of collector guide chutes positioned below said track, each one of said collector guide chutes formed with spaced and vertically disposed surfaces for holding one of said ceramic wafers in a vertical position, and means including a plurality of pairs of orienting guide surfaces between said track and said collector guide chutes with a different pair of said orienting guide surfaces extending from said each of one of said collector guide chutes to said track, each of said different one of said orienting guide surfaces being curved with an upper portion thereof positioned adjacent and substantially tangential to said supporting surface of said track and a lower portion of said curved orienting guide surface disposed in a vertical plane adjacent to a different one of said vertically disposed chute surfaces, means for releasing a number of said wafers from said track support means to drop said number of said wafers onto said orienting guide surfaces, and means adjacent to said track support means for retaining others of said wafers in said track support means during operation of said wafer release means.

2. Apparatus for aligning a plurality of flat ceramic wafers in a spaced parallel array, said wafers having a pair of parallel surfaces spaced from each other by a thickness dimension which is small relative to the dimensions of said parallel surfaces, said apparatus comprising a track having a surface for supporting said wafers with one of their parallel surfaces in a common plane and with said wafers in abutting relationship, a plurality of collector guides positioned below said track means, each one of said collector guides formed with spaced and vertically disposed surfaces for holding one of said ceramic wafers therebetween in a vertical position, and means including a plurality of orienting guide surfaces between said track support means and said collector guides with a different one of said orienting guide surfaces extending from said each of one of said collector guides to said track support means, each of said different one of said orienting guide means having a curved surface with an upper portion thereof positioned adjacent and substantially tangential to said supporting surface of said track means and a lower portion of said curved orienting guide surface disposed in a vertical plane adjacent to one of said vertically disposed surfaces of one of said collector guides, said track support means including a pair of spaced rail plates for supporting a number of said wafers therebetween, means mounting said rail plates for lateral movement away from each other, means for moving said rail plates simultaneously away from each other to release said wafers onto said orienting guide surfaces, and a stop device mounted on said base support adjacent to said track support means for retaining others of said wafers in said track support means during operation of said rail plate moving means.

3. Apparatus for aligning a plurality of flat ceramic wafers in a spaced parallel array, said wafers having a pair of parallel surfaces spaced from each other by a thickness dimension which is small relative to the dimensions of said parallel surfaces, said apparatus comprising a base support, a track support means on said base support for supporting said wafers aligned in abutting relationship, means for simultaneously releasing from said track support means a predetermined plurality of adjacently disposed wafers, a plurality of collector guides corresponding in number to that of the simultaneously released wafer, fixed to said base support and positioned below said track means for receiving the wafers as they are released from said track supporting means, each one of said collector guides formed with a pair of surfaces spaced from each other a distance only slightly greater than the thickness dimension of said wafers to hold one of said ceramic wafers in position when fed into said one collector guide, means including a plurality of orienting guide surfaces mounted on said base support between said track support means and said collector guides with a different one of said orienting guide surfaces extending from each pair of said collector guide surfaces to said track support means, said simultaneous releasing means including a pair of spaced rail plates for supporting a number of said wafers therebetween, means mounting said rail plates for lateral movement away from each other, actuating means for moving said rail plates simultaneously away from each other to release said wafers onto said orienting guide surfaces, and a stop device mounted on said base support adjacent to said track support means for retaining others of said wafers in said track support means during operation of said rail plate moving means.

4. Apparatus for aligning a plurality of flat ceramic wafers in a spaced parallel array, said wafers having a pair of parallel surfaces spaced from each other by a thickness dimension which is small relative to the dimensions of said parallel surfaces, said apparatus comprising a support means having a track surface for supporting said wafers in abutting relationship, means for simultaneously releasing from said track surface of said support means a predetermined plurality of adjacently disposed wafers, a plurality of collector guides corresponding in number to that of the simultaneously released wafer, positioned below said track means for receiving the wafers as they are released from said track supporting means, each one of said collector guides formed with spaced surfaces for holding one of said ceramic wafers therebetween, and a plurality of orienting guide means between said support means and said collector guides with a different one of said orienting guide means extending from said each of one of said collector guides to said support means, each of said different one of said orienting guide means having a curved surface with an upper portion thereof positioned adjacent and substantially tangential to said track surface of said support means and a lower portion of said curved orienting guide surface disposed in a vertical plane adjacent to a different one of said spaced surfaces of one of said collector guides.

5. Apparatus for aligning a plurality of flat ceramic wafers in a spaced parallel array, said wafers having a pair of parallel surfaces spaced from each other by a thickness dimension which is small relative to the dimensions of said parallel surfaces, said apparatus comprising a track means having a surface for supporting said wafers aligned in abutting relationship, means for simultaneously releasing from said track means a predetermined plurality of adjacently disposed wafers, a plurality of collector guides corresponding in number to that of the simultaneously released wafers, positioned below said track means for receiving the wafers as they are released from said track means, each one of said collector guides being formed with spaced surfaces for holding one of said ceramic wafers therebetween, and a plurality of orienting guide means between said track and said collector guides with a different one of said orienting guide means extending from said each of one of said collector guides to said track, each of said different one of said orienting guide means having a curved surface with an upper portion thereof positioned adjacent and substantially tangential to said supporting surface of said track and a lower portion of said curved orienting guide surface disposed in a vertical plane adjacent to a different one of said spaced surfaces of one of said collector guides, said simultaneous releasing means including actuating means to release said wafers onto said orienting guide means.

6. Apparatus for aligning a plurality of wafers in a spaced parallel array, said wafers having first and second surfaces spaced from each other by a thickness dimension which is small relative to the dimensions of said first and second surfaces, said apparatus comprising a track support means for supporting said wafers with one of said first and second surfaces thereof all in a common plane and with said wafers in abutting relationship, means for simultaneously releasing from said track support means a predetermined plurality of adjacently disposed wafers, a plurality of collector guides, corresponding in number to that of the simultaneously released wafers, positioned below said track means for receiving the wafers as they are released from said track supporting means, and means including a plurality of curvilinear orienting guide surfaces between said track support means and said respective collector guides with a different one said curvilinear orienting guide surface extending from said each one of said collector guides to a position adjacent and substantially tangential to said track support means.

7. The apparatus set forth in claim 6 wherein said track support means is disposed at an angle to horizontal.

8. Apparatus for aligning articles in a spaced parallel array, said articles having upper and lower surfaces spaced from each other by a thickness dimension which is small relative to the dimensions of said upper and lower surfaces, said apparatus comprising a support means for supporting said articles in aligned relationship, means for simultaneously releasing from said support means a pre-determined plurality of adjacently disposed articles, a plurality of guide means corresponding in number to that of the simultaneously released articles, positioned below said support means for recieving the articles as they are released from said support means, each one of said guide means being formed with means for holding one of said articles therebetween, and a plurality of orienting means between said support means and said guide means with a different one of said orienting means extending from said each of one said guide means to said support means, each of said different one of said orienting means having a curvilinear portion with an upper portion thereof positioned adjacent and substantially tangential to said support means and a lower portion of said curvilinear orienting means surface disposed in a vertical plane adjacent to a different one of said means for holding one of said articles therebetween.

References Cited in the file of this patent

UNITED STATES PATENTS

| | | |
|---|---|---|
| 1,840,370 | Ryan et al. | Jan. 12, 1932 |
| 2,586,172 | Murphy | Feb. 19, 1952 |
| 2,656,656 | Murdoch et al. | Oct. 27, 1953 |
| 2,657,404 | Kasper | Nov. 3, 1953 |
| 2,669,341 | Holstebroe et al. | Feb. 16, 1954 |